United States Patent [19]

Tanida et al.

[11] Patent Number: 5,694,352
[45] Date of Patent: Dec. 2, 1997

[54] SEMICONDUCTOR MEMORY DEVICE HAVING LAYOUT AREA OF PERIPHERY OF OUTPUT PAD REDUCED

[75] Inventors: Susumu Tanida; Yasuhiko Tsukikawa; Kiyohiro Furutani; Takayuki Miyamoto, all of Hyogo, Japan

[73] Assignee: Mitsubishi Denki Kabushiki Kaisha, Tokyo, Japan

[21] Appl. No.: 676,705

[22] Filed: Jul. 8, 1996

[30] Foreign Application Priority Data

Nov. 17, 1995 [JP] Japan .................................. 7-299770

[51] Int. Cl.⁶ .................................................. G11C 5/06
[52] U.S. Cl. .......................................... 365/51; 365/63
[58] Field of Search ............................. 365/189.05, 51, 365/63, 72

[56] References Cited

U.S. PATENT DOCUMENTS

| | | | |
|---|---|---|---|
| 5,436,865 | 7/1995 | Kitazawa | 365/194 |
| 5,500,817 | 3/1996 | McLaury | 365/189.05 |
| 5,532,961 | 7/1996 | Mori | 365/189.05 |

FOREIGN PATENT DOCUMENTS 2-186668   7/1990   Japan .

Primary Examiner—David C. Nelms
Assistant Examiner—Son Mai
Attorney, Agent, or Firm—Lowe, Price, LeBlanc & Becker

[57] ABSTRACT

A semiconductor memory device includes four memory cell arrays, four output pads formed in a linear manner at the center of a semiconductor substrate, four output control circuits for generating readout data signals and control signals, four signal generation circuits responsive to the readout data signals for generating complementary pairs of data signals, and responsive to the control signals, four signal line groups including four signal lines connected between the output control circuits and the signal generation circuits, four output drivers responsive to pairs of data signals for supplying data to the output pads, and four signal line pairs connected between the signal generation circuits and output drivers. Signal generation circuits of great size are arranged at the center of the semiconductor substrate where the layout margin is great, and only the output driver is arranged in the proximity of the output pad where the layout margin is small. Therefore, the chip area is reduced. Access is speeded since the signal lines forming the signal line group are shorter in length, though greater in number, than the signal lines forming the signal line pair.

4 Claims, 6 Drawing Sheets

5,694,352

1

SEMICONDUCTOR MEMORY DEVICE HAVING LAYOUT AREA OF PERIPHERY OF OUTPUT PAD REDUCED

BACKGROUND OF THE INVENTION

1. Field of the Invention

The present invention relates to semiconductor memory devices, and more particularly, to a semiconductor memory device that has the layout area of circuitry and wiring at the periphery of an output pad limited.

2. Description of the Background Art

FIG. 5 shows an example of a layout of an output control circuit 505, an output circuit 507, an output pad 109, a bundle of signal lines 111, and a signal line 115 on a semiconductor substrate 102 of a chip 500 of a conventional semiconductor memory device. FIG. 6 shows signals generated by output control circuit 505 of FIG. 5 and the bundle of signal lines 111 through which these signals are transmitted.

Referring to FIG. 5, output control circuit 505 and output circuit 507 are connected by the bundle of signal lines 111 on semiconductor substrate 102. Referring to FIG. 6, the bundle of signal lines 111 includes four signal lines 1, 2, 3 and 4 through which a readout data signal RD, a readout data signal $\overline{RD}$, an output data latch signal $\overline{ODL}$, and a data output control signal OEM generated from output control circuit 505 are transmitted. Referring to FIG. 5 again, output control circuit 507 is disposed in the proximity of output pad 109. Data output from output circuit 507 is transmitted to output pad 109 via signal line 115.

Referring to FIG. 6 again, readout data signal RD, readout data signal $\overline{RD}$, output data latch signal $\overline{ODL}$, and data output control signal OEM generated at output control circuit 505 are transmitted to output circuit 507 via signal line 1, signal line 2, signal line 3, and signal line 4, respectively.

FIG. 7 shows an example of a structure of output circuit 507 of FIG. 5 together with output pad 109.

Referring to FIG. 7, a conventional output circuit 507 includes a latch circuit 301 responsive to output data latch signal $\overline{ODL}$ of an L (logical low) level for latching readout data signals RD and $\overline{RD}$, a NAND gate 303 receiving readout data signal RD latched by latch circuit 301, and responsive to data output control signal OEM for providing a data signal $\overline{HOUT}$ that is an inverted version of readout data signal RD, a NAND gate 305 receiving readout data signal $\overline{RD}$, and responsive to data output control signal OEM for providing a data signal $\overline{LOUT}$ which is an inverted version of readout data signal $\overline{RD}$, an inverter 701 for receiving data signal $\overline{HOUT}$ provided from NAND gate 303, an inverter 703 receiving data signal $\overline{LOUT}$ provided from NAND gate 305, an N channel MOS transistor (referred to as "NMOS transistor" hereinafter) with a drain electrode connected to an external power supply node extVcc and a gate electrode connected to an output terminal of inverter 701, and an NMOS transistor 707 having a source electrode connected to a ground node, a gate electrode connected to an output terminal of inverter 703, and a drain electrode connected to a source electrode of NMOS transistor 705.

The output terminal of latch circuit 301 and an input terminal of NAND gate 303 are connected by a signal line 5. The output terminal of latch circuit 301 and the input terminal of NAND gate 305 are connected by a signal line 6. The output terminal of NAND gate 303 and the input terminal of inverter 701 are connected by a signal line 7. The

2 output terminal of NAND gate 305 and the input terminal of inverter 703 are connected by a signal line 8. The output terminal of inverter 701 and the gate electrode of NMOS transistor 705 are connected by a signal line 9. The output terminal of inverter 703 and the gate electrode of NMOS transistor 707 are connected by a signal line 10. The source electrode of NMOS transistor 705 and the drain electrode of NMOS transistor 707 are both connected to output pad 109 via signal line 115.

FIG. 8 shows an example of a structure of latch circuit 301 of FIG. 7.

Referring to FIG. 8, latch circuit 301 includes NAND gates 801 and 803, and RS flipflops 805 and 807.

Output data signal RD and output data latch signal $\overline{ODL}$ are provided to NAND gate 801 via signal line 1 and signal line 3, respectively. The output of NAND gate 801 is applied to RS flipflops 805 and 807. Readout data signal $\overline{RD}$ and output data latch signal $\overline{ODL}$ are provided to NAND gate 803 via signal line 2 and signal line 3, respectively. The output of NAND gate 803 is also applied to RS flipflops 805 and 807. The output of RS flipflop 805 is provided to NAND gate 303 of FIG. 7 and the output of RS flipflop 807 is provided to NAND gate 305 of FIG. 7.

FIG. 9 is a timing chart showing an operation of circuitry formed of output control circuit 505, output circuit 507, output pad 109, bundle of signal lines 111, and signal line 115 of FIG. 5.

Referring to FIG. 9, readout data signal RD attains an H (logical high) level at time T1, and output data latch signal $\overline{ODL}$ attains an L level at time T2. In response, readout data signal RD of an H level is latched, and the data signal of signal line 5 is driven to an H level. When data output control signal OEM attains an H level at time T3, data signal $\overline{HOUT}$ of signal line 7 is driven to an L level. In response to data signal $\overline{HOUT}$ of an L level, the data signal of signal line 9 is pulled up to an H level, whereby NMOS transistor 705 is turned on. As a result, data of an H level is supplied to output pad 109. Since output data latch signal $\overline{ODL}$ remains at an L level even when readout data signal RD is pulled down to an L level at time T4, the level of the data signal latched in latch circuit 301 is maintained. Therefore, the data signal of signal line 5 maintains its H level. In response to data output control signal OEM driven to an L level at time T5, data signal $\overline{HOUT}$ which is an output of NAND gate 303 is pulled up to an H level. In response to data signal $\overline{HOUT}$ of an H level, the output of inverter 701 is pulled down to an L level, whereby transistor 505 is turned off. As a result, output pad 109 attains a high impedance state of Hi-Z. When output data latch signal $\overline{ODL}$ attains an H level at time T6, latch circuit 301 is reset, and the data signal of signal line 5 is pulled down to an L level.

Although the above description is provided for an output pad 109 having an output of an H level, the same applies for output pad 109 having an output of an L level by just substituting readout data signal RD with readout data signal $\overline{RD}$. This operation is shown in the timing chart of FIG. 9 subsequent to time T7.

More specifically, when readout data signal $\overline{RD}$ attains an H level at time T7, and output data latch signal $\overline{ODL}$ attains an L level at time T8, readout data signal RD of an L level is latched, and the data signal of signal line 6 pulled up to an H level. When data output control signal OEM is pulled up to an H level at time T9, data signal $\overline{LOUT}$ of signal line 8 is pulled down to an L level. In response to data signal $\overline{LOUT}$ of an L level, the data signal of signal line 10 is pulled up to an H level, whereby NMOS transistor 707 is turned on.

As a result, data of an L level is supplied to output 109. Since output data latch signal $\overline{ODL}$ remains at an L level even when readout data signal $\overline{RD}$ attains an L level at time T10, the level of the data signal latched in latch circuit 301 is maintained, and the data signal of signal line 6 maintains its H level. In response to data output control signal OEM attaining an L level at time of T11, data signal $\overline{LOUT}$ which is an output of NAND gate 303 is driven to an H level. In response to data signal $\overline{LOUT}$ of an H level, the output of inverter 703 is pulled down to an L level, whereby transistor 507 is turned off. As a result, output pad 109 attains a high impedance state of Hi-Z. When output data latch signal $\overline{ODL}$ attains an H level at time T12, latch circuit 301 is reset, and the data signal of signal line 6 is pulled down to an L level.

When the area of a chip must be reduced due to design criteria, the area allowed for layout of circuitry and wiring in the proximity of the output pad and the input pad will be limited.

FIGS. 10A and 10B show the manner of shrinking of a chip. FIGS. 10a and 10b show a chip before (100') and after (100") shrinking.

Referring to FIG. 10A, memory cell arrays 101a', 101b', 101c' and 101d' are arranged in two rows and two columns at predetermined intervals on a semiconductor chip 102' of chip 100'. A plurality of input/output pads including output pads 109a, 109b, 109c, and 109d for the output circuit are linearly arranged at predetermined intervals between the first row of memory cell arrays 101c' and 101d' and the second row of memory cell arrays 101a' and 101b'.

The length of the shorter side of semiconductor substrate 102' is designated L', the length of the shorter side of each of memory cell array 101a'–101d' is designated $L_A'$, the distance between memory cell array 101b' and 101d' (or between memory cell array 101a' and 101d') is designated $L_B'$, the length of one side of each of output pads 109a–109d is designated P, and the distance between the first row of memory cell arrays 101c' and 101d' and output pads 109a–109d is designated $L_O'$.

Referring to FIG. 10B, memory cell arrays 101a, 101b, 101c, and 101d are disposed in two rows and two columns at predetermined intervals on semiconductor substrate 102 on chip 100". A plurality of input/output pads including output pads 109a–109d are disposed linearly between the first row of memory cell arrays 101c and 101d and the second row of memory cell arrays 101a and 101b.

The length of the shorter side of the shrunk semiconductor substrate 102 is designated L, the length of the shorter side of each of memory cell arrays 101a–101d is designated $L_A$, the distance between memory cell arrays 101b and 101d (or between memory cell arrays 101b and 101d) is designated $L_B$, and the distance between the first row of memory cell arrays 101c and 101d and output pads 109a–109d is designated $L_O$. Here, the length of one side of each of output pads 109a–19d is P, independent of shrinking.

The shrinking rate K is represented by the following equation of (1) using these parameters.

$$\frac{L}{L'} = \frac{L_A}{L_A'} = \frac{L_B}{L_B'} = K \quad (1)$$

However, in chip 100' prior to the shrinking as shown in FIG. 10A, and chip 100" after shrinking as shown in FIG. 10B, the shrinking rate K is expressed by the following relationship (2) since the length P of one side of output pads 109a–109d, (and also other input/output pads) is the same.

$$K > \frac{L_O}{L_O'} \quad (2)$$

Therefore, there was a problem that the layout in the proximity of the pads is further limited by shrinking.

In the conventional example shown in FIGS. 5–9, the area in which layout is allowed in the periphery of the input/output pads is extremely contracted since the design value of the periphery of the pad is not scaled down to correspond to the reduced chip area on a DRAM chip. Thus, there was a problem that almost all the circuitry forming output control circuit 505 and output circuit 507 shown in FIG. 5 and wiring therefor cannot be disposed in the proximity of the output pad.

For example, the four signal lines 1–4 connected to output control circuit 505 occupy a great area in the proximately of the output pad, which becomes a bottleneck in shrinking the chip area. This problem becomes particularly noticeable as the number of output pins is increased.

SUMMARY OF THE INVENTION

An object of the present invention is to provide a semiconductor memory device that can have the number reduced of circuitry and wiring arranged in the proximity of a pad portion where the layout area is limited to allow reduction of the chip size.

Another object of the present invention is to provide a semiconductor memory device that allows high speed access using a complementary bus.

According to an aspect of the present invention, a semiconductor memory device includes a semiconductor substrate, a memory cell array formed on the semiconductor substrate, an output pad formed on the semiconductor substrate, a signal generation circuit formed on the semiconductor substrate, and responsive to a first signal supplied from the memory cell array for generating a second signal, a first number of first signal lines formed on the semiconductor substrate and connected between the memory cell array and the signal generation circuit for transmitting the first signal, an output driver formed on the semiconductor substrate, and responsive to a second signal from the signal generation circuit for supplying a data signal to the output pad, a second number of second signal lines, fewer in number than the first signal lines, formed on the semiconductor substrate and connected between the signal generation circuit and the output driver for transmitting the second signal. The first signal line is shorter than the second signal line.

According to another aspect of the present invention, a semiconductor memory device includes a semiconductor substrate, a plurality of memory cell arrays formed on the semiconductor substrate, a plurality of output pads formed linearly corresponding to the plurality of memory cell arrays with a predetermined interval at the center of the semiconductor substrate, a plurality of output control circuits formed on the semiconductor substrate corresponding to the plurality of memory cell arrays, each output control circuit generating a readout data signal read out from a corresponding memory cell and a predetermined control signal, a plurality of signal generation circuits formed at the center on the semiconductor substrate corresponding to a plurality of memory cell arrays, each signal generation circuit responsive to a readout data signal from a corresponding output control circuit for generating a pair of data signals complementary to each other, and controlled in response to a control signal from a corresponding output control circuit, a plurality of signal line groups formed on the semiconductor substrate corresponding to the plurality of memory cell arrays, each signal line group including at least 3 signal lines connected between a corresponding output control circuit and a corresponding signal generation circuit for transmitting a readout data signal and a control signal, a plurality of output drivers formed on the semiconductor substrate corresponding to the plurality of memory cell arrays, each output driver disposed in the proximity of a corresponding output pad, and responsive to a pair of data signals from a corresponding signal generation circuit for supplying data to a corresponding output pad, and a plurality of signal line pairs formed on the semiconductor substrate corresponding to the plurality of memory cell arrays, each signal line pair connected between a corresponding signal generation circuit and a corresponding output driver for transmitting a pair of data signals.

The main advantage of the present invention is that the chip area is reduced by virtue of a large signal generation circuit being arranged at the center of a semiconductor substrate where the layout margin is great and only the output driver is disposed in the proximity of the output pad where the layout margin is small. There is also the advantage that access is speeded since the signal lines forming the signal line group is shorter in length, though greater in number, than the signal lines forming the signal line pairs.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

Figure 1:
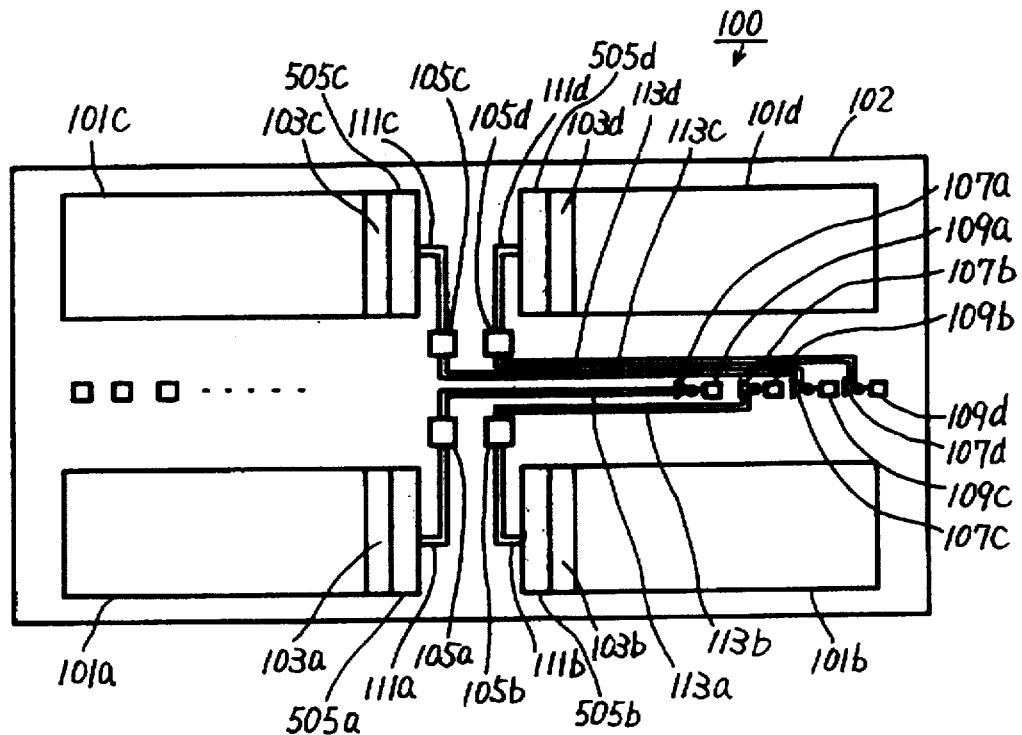
FIG. 1 is a layout diagram showing a semiconductor memory device according to an embodiment of the present invention.

Referring to FIG. 1, four memory cell array 101a–101d, preamplifiers 103a–103d corresponding to memory cell arrays 101a–101d, output control circuits 505a–505d for generating a readout data signal, an output data latch signal, and an output control signal, signal generation circuits 105a–105d for generating a data signal, output drivers 107a–107d, and output pads 109a–109d are disposed on a semiconductor substrate 102 of a chip 100 in a DRAM. The major area of the chip is occupied by memory cell arrays, and the peripheral control circuitry and wiring are disposed between the space of the memory cell arrays.

For facilitating the control, signal generation circuits 105a–105d are arranged at the center of the chip. Since this semiconductor device employs the LOC (Lead On Chip) system, output pads 109a–109d are arranged in a linear manner at predetermined intervals at the center of the semiconductor substrate.

According to the layout of semiconductor substrate 102 of chip 100 in FIG. 1, a plurality of input/output pads including output pads 109a–109d are arranged in a straight line at predetermined intervals between the first row of memory cell array 101c and 101d and the second row of memory cell 101a and 101b arranged in two rows and two columns. Examples of input pads include those for address signal input, row address strobe signal input, column address strobe signal input, power supply voltage Vcc input, and the like.

Output drivers 107a–107d are arranged corresponding to output pads 109a–109d in the proximity of output pads 109a–109d. Signal generation circuits 105a–105d corresponding to output pads 109a–109d are arranged on semiconductor substrate 102 at the center area. Signal generation circuits 105a–105d are connected to output driver 107a–107d via signal line pairs 113a–113a through which complementary data are transmitted. Preamplifiers 103a–103a are connected to signal generation circuits 105a–105d via a bundle of signal lines 111a–111d formed of four signal lines.

In FIG. 1, only four output pads 109a–109d to provide data outside are shown out of the plurality of input/output pads. Output pads 109a–109d are arranged in a linear manner at predetermined intervals between memory cell array 101d and memory cell array 101b arranged on semiconductor substrate 102. Each of output drivers 107a–107d is disposed in the proximity of the left side of each of output pads 109a–109d, respectively.

Figure 2:
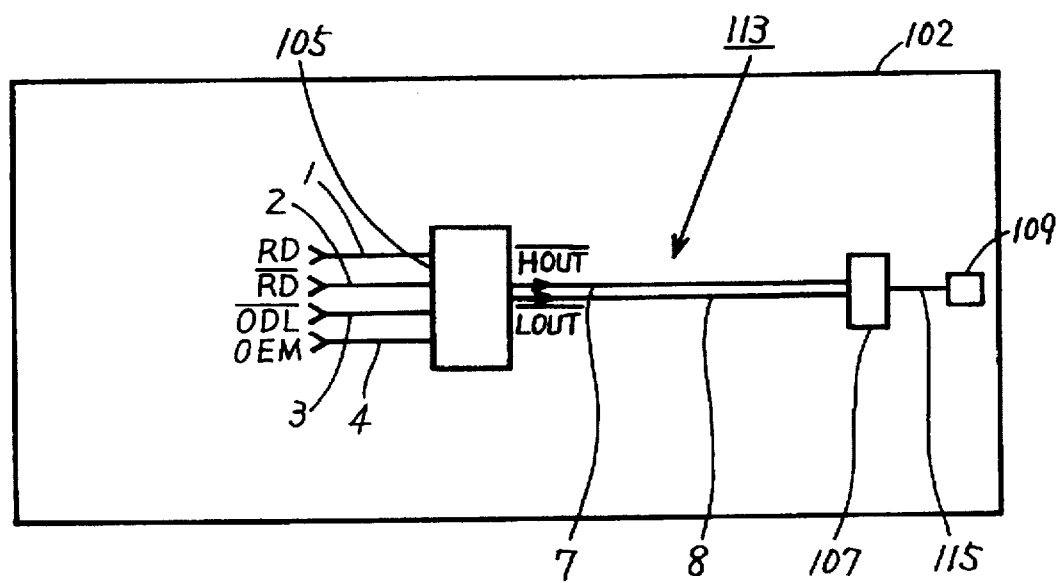
FIG. 2 is a layout diagram showing a signal generation circuit, an output driver, an output pad, and a signal line pair on a semiconductor substrate of a semiconductor memory device of FIG. 1.

In FIG. 2, one signal generation circuit 105 representative of four signal generation circuits 105a–105d of FIG. 1, one output driver 107 representative of four output drivers 107a–107d, one output pad 109 representative of four output pads 109a–109d, and one signal line pair 113 representative of four signal line pairs 113a–113a are shown.

Referring to FIG. 2, signal line pair 113 includes a signal line 7 for transmitting data signal $\overline{HOUT}$, and a signal line 8 for transmitting a data signal $\overline{LOUT}$. Output driver 107 is disposed in the proximity of output pad 109. Output driver 107 is connected to output pad 109 via signal line 115. Signal generation circuit 105 is disposed remote from output pad 109 on semiconductor substrate 102 at the center portion thereof where there is layout margin. Signal generation circuit 105 is connected to output driver 107 via signal line pair 113. Signal generation circuit 105 receives data signals RD and $\overline{RD}$, output data latch signal $\overline{ODL}$, and data output control signal OEM. Data signals RD and $\overline{RD}$, output data latch signal $\overline{ODL}$, and data output control signal OEM are generated by each of output control circuits 105a–105d of FIG. 1.

Figure 3:
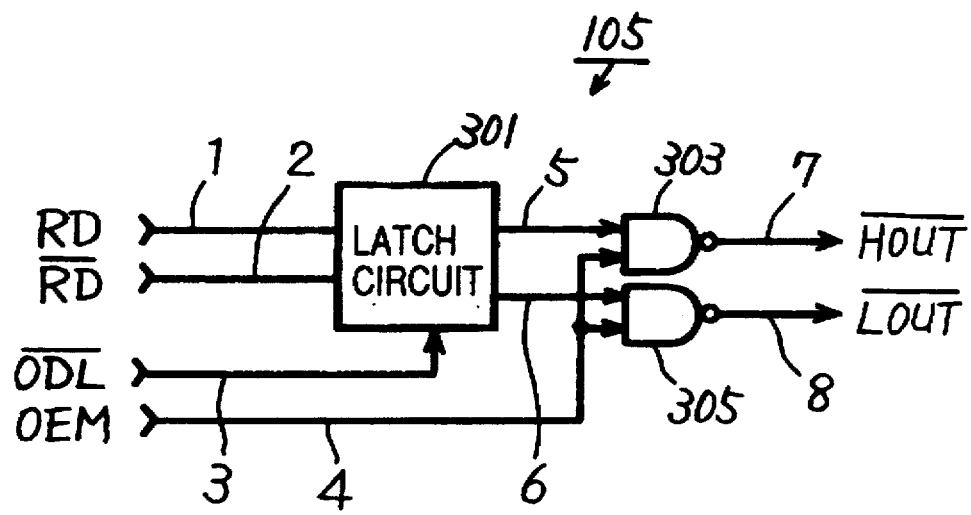
FIG. 3 is a block diagram showing a structure of a signal generation circuit of FIG. 2.

Referring to FIG. 3, signal generation circuit 105 includes a latch circuit 301 responsive to output data latch signal $\overline{ODL}$ for latching readout data signals RD and $\overline{RD}$, and NAND gates 303 and 305.

Figure 8:
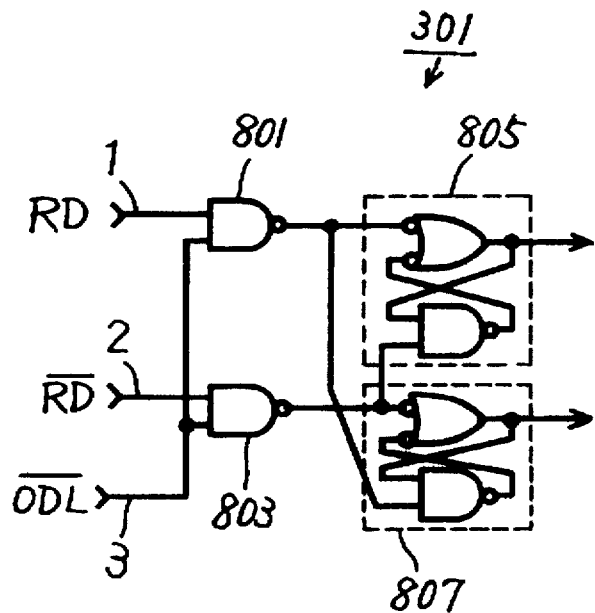
FIG. 8 is a circuit diagram showing a structure of latch circuit of FIG. 7.

Latch circuit 301 includes three input terminals respectively connected to signal line 1 through which readout data signal RD is transmitted, signal line 2 through which readout data $\overline{RD}$ is transmitted, and signal line 3 through which output data latch signal $\overline{ODL}$ is transmitted. Latch circuit 301 further includes output terminals respectively connected to signal line 5 through which a latched data signal is transmitted, and a complementary signal line 6. Signal line 5 is connected to one input terminal of NAND gate 303. Signal line 6 is connected to one input terminal of NAND gate 305. The other input terminal of NAND gate 303 and the other input terminal of NAND gate 305 are both connected to signal line 4 through which data output control signal OEM is transmitted. The output terminal of NAND gate 303 is connected to signal line 7, and the output terminal of NAND gate 305 is connected to signal line 8. Data signal $\overline{HOUT}$ is transmitted through signal line 7, and data signal $\overline{LOUT}$ which is complementary to data signal $\overline{HOUT}$ is transmitted through signal line 8. The structure of latch circuit 301 is similar to that shown in FIG. 8.

Figure 4:
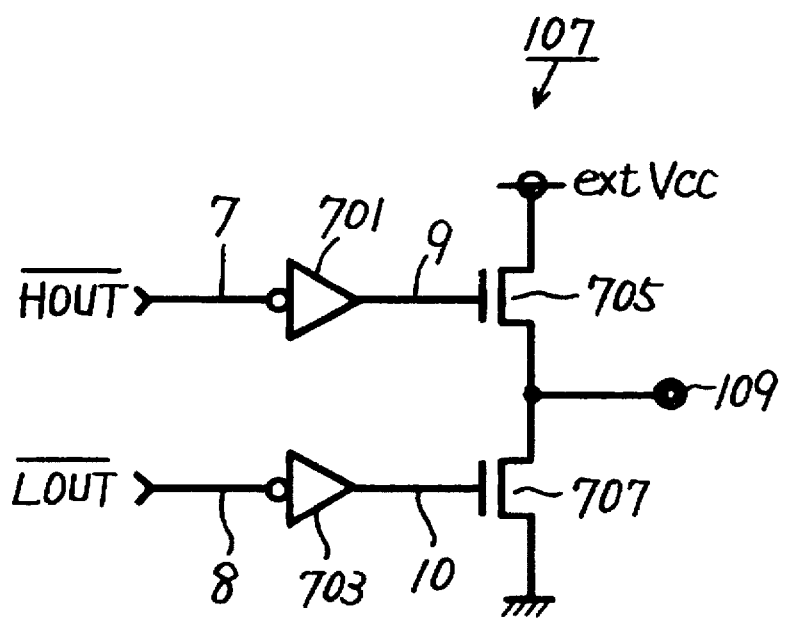
FIG. 4 is a circuit diagram showing a structure of an output driver of FIG. 2.
Figure 5:
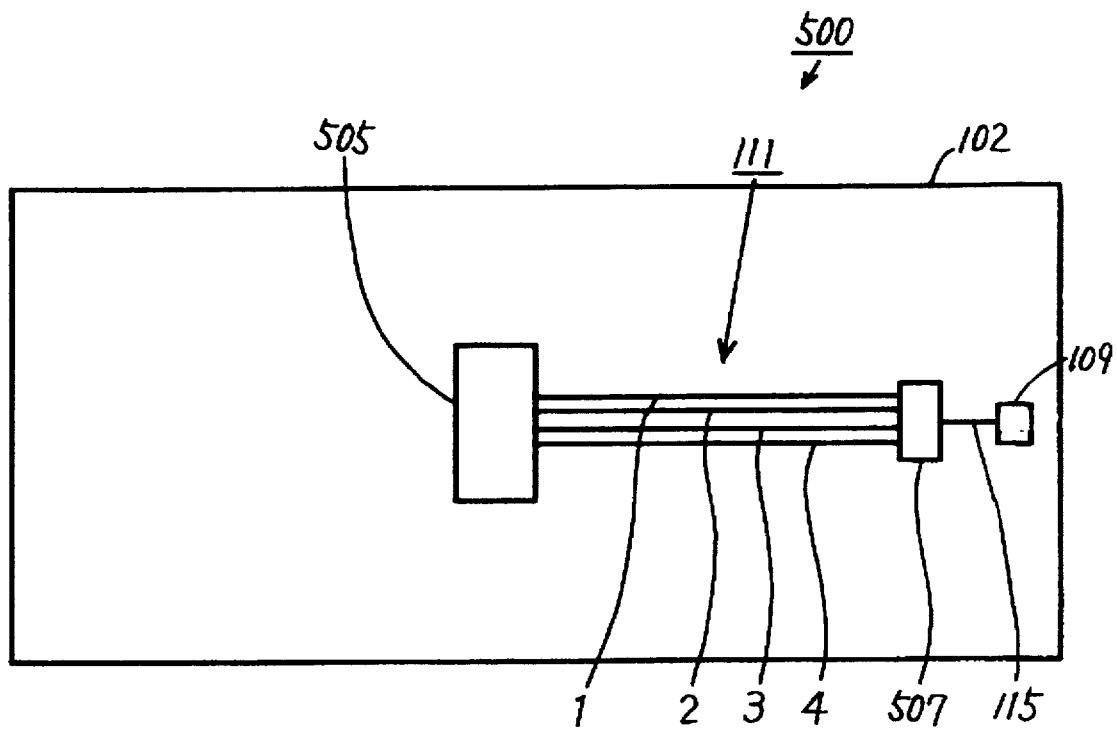
FIG. 5 is a layout diagram showing an output control circuit, an output circuit, an output pad, and a bundle of signal lines on a semiconductor substrate of a conventional semiconductor memory device.
Figure 6:
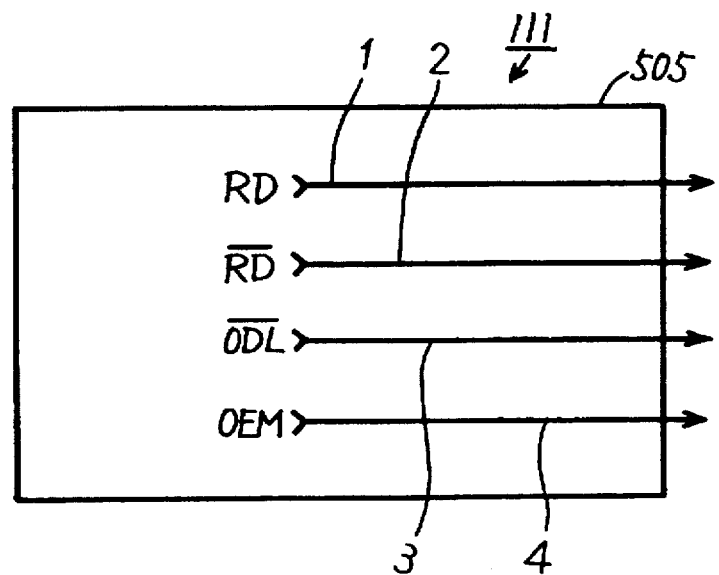
FIG. 6 shows signals generated from the output control circuit in FIG. 5 and the bundle of signal lines transmitting the signals.
Figure 7:
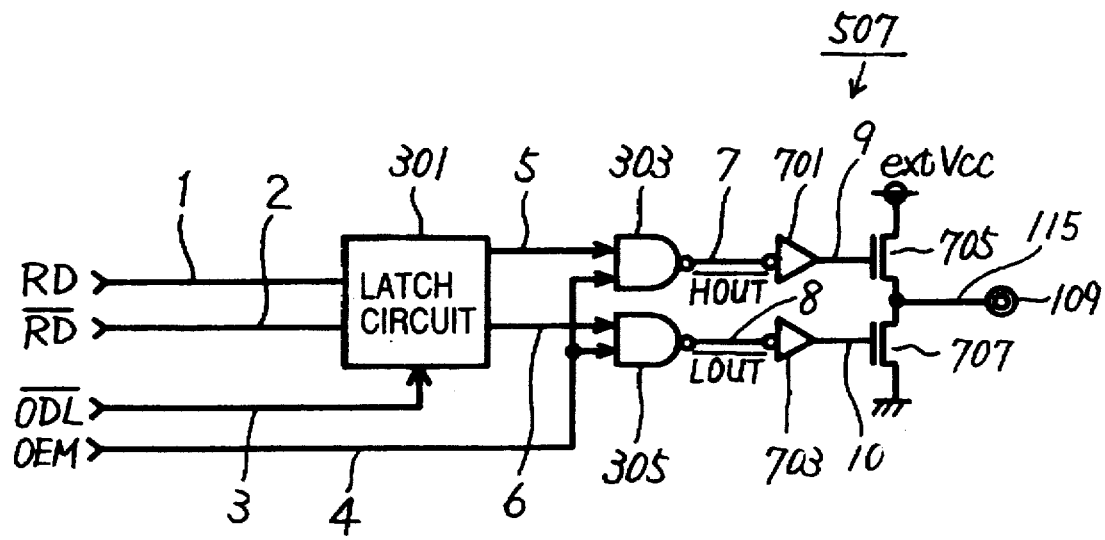
FIG. 7 is a block diagram showing a structure of an output circuit of FIG. 5.

Referring to FIG. 4, output driver 107 includes inverters 701 and 703, and NMOS transistors 705 and 707.

The input terminal of inverter 701 is connected to signal line 7 to receive data signal $\overline{HOUT}$. The input terminal of inverter 703 is connected to signal line 8 to receive data signal $\overline{LOUT}$. NMOS transistor 705 has a drain electrode connected to a power supply node extVcc, and a source electrode connected to output pad 109. NMOS transistor 707 has a drain electrode connected to a source electrode of NMOS transistor 705 and to output pad 109, and a source electrode grounded. The gate electrode of NMOS transistor 705 is connected to the output terminal of inverter 701 via signal line 9. The gate electrode of NMOS transistor 707 is connected to the output terminal of inverter 703 via signal line 10. NMOS transistors 705 and 707 form an N—N buffer whose output is connected to output pad 109. Therefore, $\overline{HOUT}$ of an L level turns on transistor 705, and $\overline{LOUT}$ of an L level turns on transistor 707.

Figure 9:
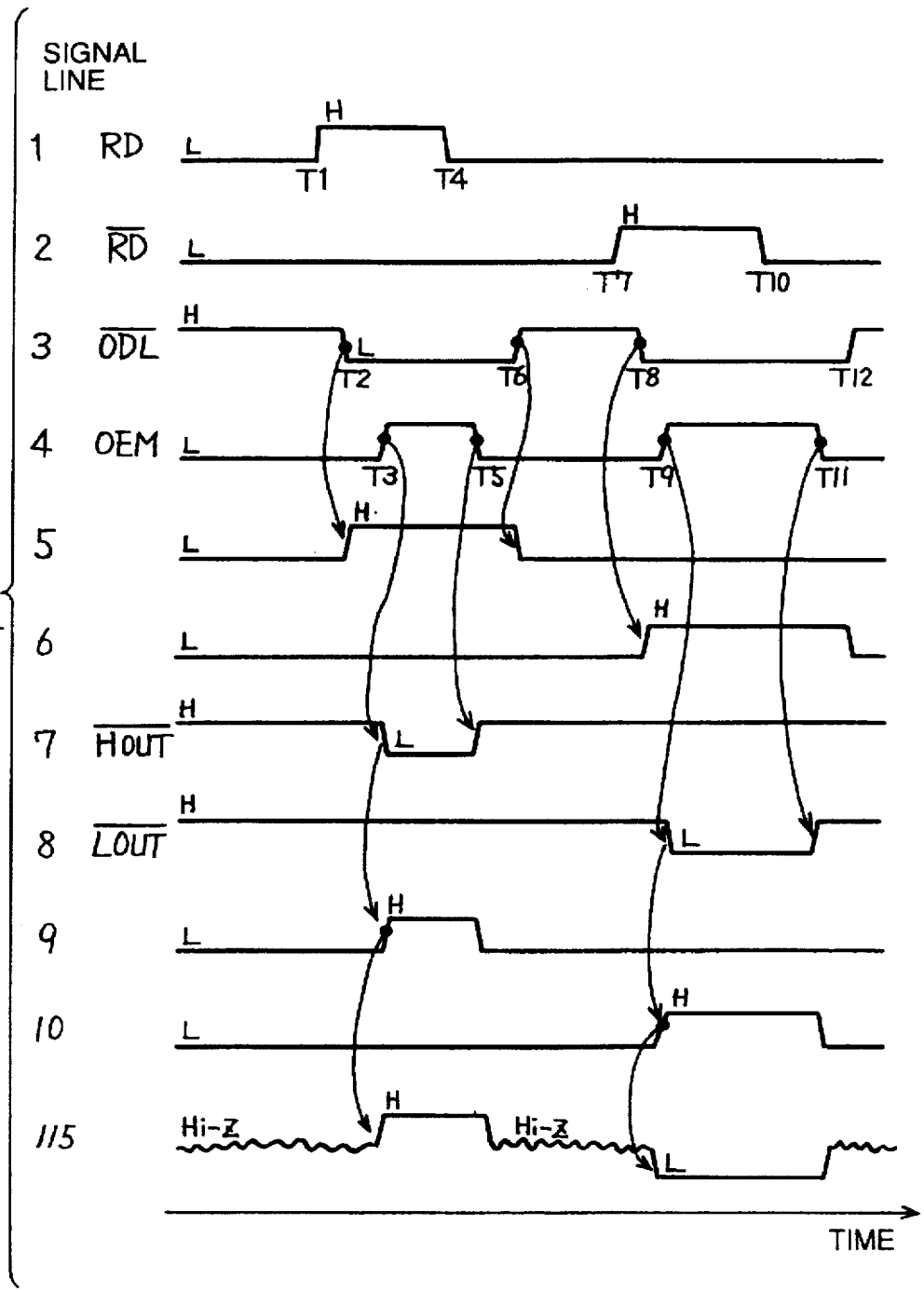
FIG. 9 is a timing chart showing the operation of circuitry formed of conventional output control circuit, the output circuit, and the bundle of signal lines of FIGS. 5–8.
Figure 10A:
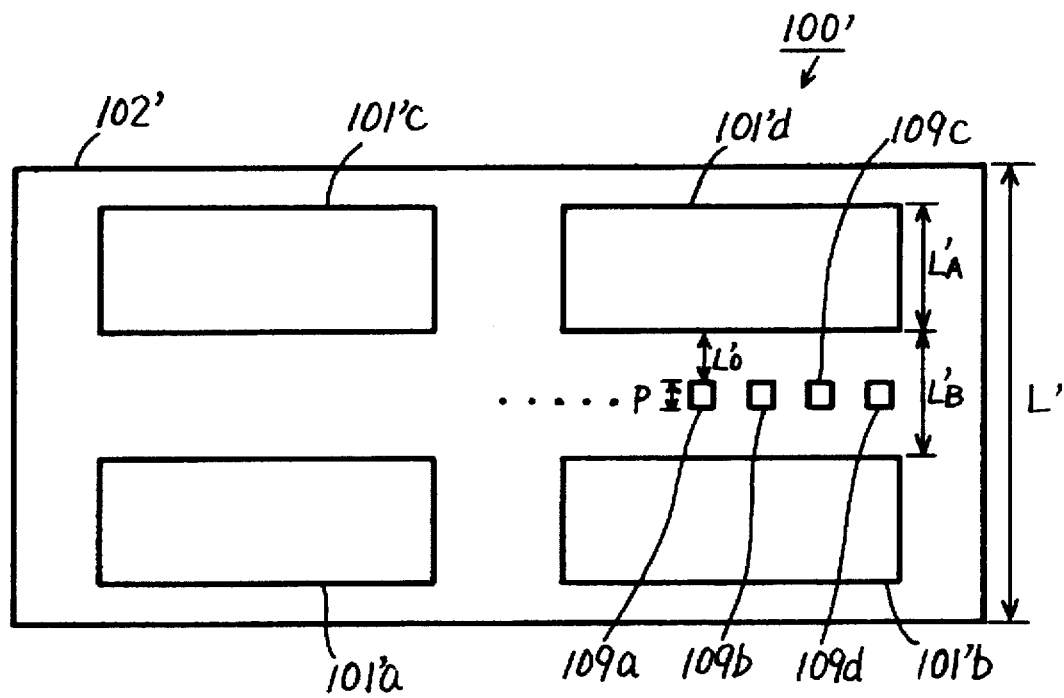
FIGS. 10A and 10B show the shrinking manner of a chip, the former and latter showing a chip before and after shrinking, respectively.
Figure 10B:
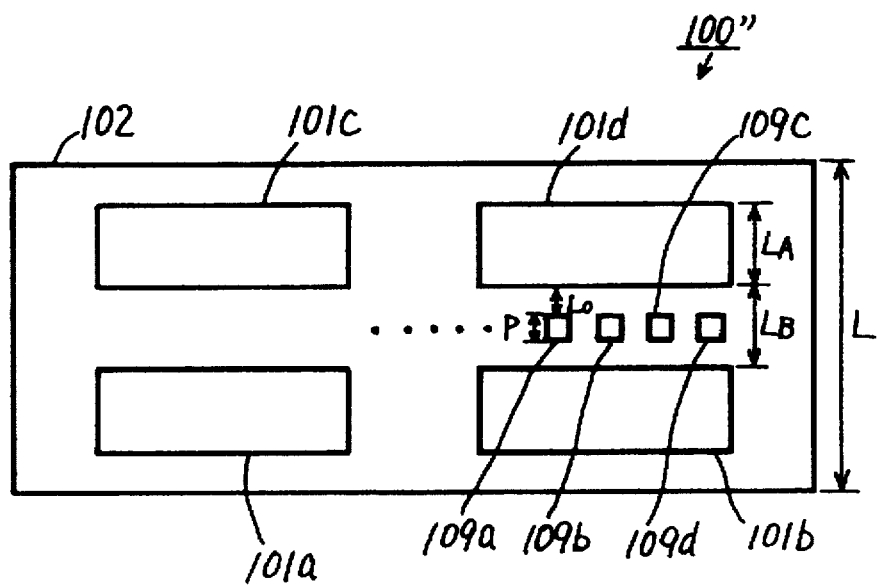

In the above-described semiconductor memory device of the present embodiment, the operation of the circuitry formed of signal generation circuit 105, output driver 107 and the bundle of signal lines 113 connecting the same is substantially similar to that described in the timing chart of FIG. 9.

In contrast to the conventional wiring of the bundle of signal lines 111 formed of power signal lines 1–4 taking a considerable length from output control circuit 505 to the proximity of output pad 109, the wiring of signal line pair 113 of signal lines 7 and 8 in the semiconductor memory device of the present embodiment is arranged in a lengthy manner on semiconductor substrate 102 of the shrinked chip 100. In other words, the number of signal lines 7 and 8 (two) forming each of signal line pairs 113a–113a is fewer than the number of signal lines 1–4 (four) forming each of bundle of signal lines 111a–111d, and the bundle of signal lines 111a–111d is shorter in length than signal line pairs 113a–113a. By reducing significantly the area of wiring region on the semiconductor substrate, layout is allowed within a limited area in the proximity of output pads 109a–109d after shrinking.

There is also the advantage that the readout speed is not degraded since the number of stages of logic circuits and the length of the total wiring in the readout path do not change from those of the conventional case.

Only two signal lines 7 and 8 for transmitting data signals $\overline{HOUT}$ and $\overline{LOUT}$ have to be disposed in the proximity of output pads 107a–107d. It is not necessary to arrange a signal line for transmitting output data latch signal $\overline{ODL}$ and data output control signal OEM. Also, only output drivers 107a–107d have to be disposed in the proximity of output pads 109a–109d. The other logic circuits do not have to be arranged. Therefore, the number of circuits in the proximity of output pads 109a–109d can be reduced. Furthermore, access can be speeded by complementary signal lines 7 and 8. Thus, a semiconductor memory device that is smaller in chip size can be provided without degradation in the readout speed.

The number of output pads is not limited to four as in the above-described embodiment, and may be 1, 8, 16 or 32. The effect of suppressing increase in the chip size becomes greater as the number of output pads is increased in the semiconductor memory device to which the present invention is applied.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a semiconductor substrate, a memory cell array formed on said semiconductor substrate, an output pad formed on said semiconductor substrate, signal generation means formed on said semiconductor substrate, and responsive to a first signal produced by said memory cell array for generating a second signal, a first number of first signal lines formed on said semiconductor substrate, and connected between said memory cell array and said signal generation means for transmitting said first signal, supply means formed on said semiconductor substrate, and responsive to said second signal from said signal generation means for supplying a data signal to said output pad, and a second number of second signal lines fewer in number than said first signal lines, formed on said semiconductor substrate and connected between said signal generation means and said supply means for transmitting said second signal.

2. The semiconductor memory device according to claim 1, wherein said supply means comprises a first N channel MOS transistor having a drain electrode connected to a power supply, and a source electrode connected to said output pad, and a second N channel MOS transistor having a drain electrode connected to said output pad, and a source electrode grounded, wherein said second signal lines include a signal line pair for transmitting data signals complementary to each other, one signal line of said signal line pair is connected to a gate electrode of said first N channel MOS transistor, and the other signal line is connected to a gate electrode of said second N channel MOS transistor.

3. A semiconductor memory device comprising:

a semiconductor substrate, a plurality of memory cell arrays formed on said semiconductor substrate, a plurality of output pads corresponding to said plurality of memory cell arrays, and formed at predetermined intervals in a straight line at the center of said semiconductor substrate, a plurality of output control circuits formed on said semiconductor substrate corresponding to said plurality of memory cell arrays, each output control circuit for providing a readout data signal readout from a corresponding memory cell array and generating a predetermined control signal, a plurality of signal generation circuits formed on said semiconductor substrate at the center portion thereof corresponding to said plurality of memory cell arrays, each signal generation circuit responsive to said readout data signal provided from a corresponding output control circuit for generating a pair of data signals complementary to each other, and controlled in response to said control signal from said corresponding output control circuit, a plurality of signal line groups formed on said semiconductor substrate corresponding to said plurality of memory cell arrays, each signal line group including at least three signal lines connected between a corresponding output control circuit and a corresponding signal generation circuit for transmitting said readout data signal and said control signal, a plurality of output drivers formed on said semiconductor substrate corresponding to said plurality of memory cell arrays, each output driver arranged in the proximity of a corresponding output pad, and responsive to said pair of readout signals from a corresponding signal generation circuit for supplying data to a corresponding output pad, and a plurality of signal line pairs formed on said semiconductor substrate corresponding to said plurality of memory cell arrays, each signal line pair connected between a corresponding signal generation circuit and a corresponding output driver for transmitting said pair of data signals.

4. The semiconductor memory device according to claim 3, wherein each of said output drivers includes a first N channel MOS transistor having a drain electrode connected to a power supply, and a source electrode connected to said corresponding output pad, and a second N channel MOS transistor having a drain electrode connected to said corresponding output pad and a source electrode grounded, wherein one signal line of each of said signal line pairs is connected to a gate electrode of said first N channel MOS transistor in said corresponding output driver, and the other signal line is connected to a gate electrode of said second N channel MOS transistor in said corresponding output driver.

* * * * *